United States Patent
Lin et al.

(10) Patent No.: US 9,318,208 B1
(45) Date of Patent: Apr. 19, 2016

(54) METHOD FOR OPERATING SMALL-AREA EEPROM ARRAY

(71) Applicant: YIELD MICROELECTRONICS CORP., Hsinchu County (TW)

(72) Inventors: Hsin-Chang Lin, Hsinchu County (TW); Wen-Chien Huang, Hsinchu County (TW); Ya-Ting Fan, Hsinchu County (TW); Yang-Sen Yeh, Hsinchu County (TW); Cheng-Ying Wu, Hsinchu County (TW)

(73) Assignee: Yield Microelectronics Corp., Chu-Pei (TW)

( * ) Notice: Subject to any disclaimer, the term of this patent is extended or adjusted under 35 U.S.C. 154(b) by 0 days.

(21) Appl. No.: 14/572,931

(22) Filed: Dec. 17, 2014

(51) Int. Cl.
*G11C 16/14* (2006.01)
(52) U.S. Cl.
CPC .................................. *G11C 16/14* (2013.01)
(58) Field of Classification Search
CPC ............................... G11C 16/14; G11C 16/107
USPC ............ 365/185.05, 185.08, 185.11, 185.12, 365/185.13, 185.29, 185.18
See application file for complete search history.

(56) References Cited

U.S. PATENT DOCUMENTS

| | | | | |
|---|---|---|---|---|
| 5,526,307 A * | 6/1996 | Yiu | ........................ | G08G 1/017 257/316 |
| 5,691,938 A * | 11/1997 | Yiu | .................... | G11C 16/0491 257/316 |
| 5,978,270 A * | 11/1999 | Tanaka | ................ | G11C 16/0416 365/185.11 |
| 6,194,759 B1 * | 2/2001 | Sano | .................... | G11C 11/5635 257/314 |
| 6,687,154 B2 * | 2/2004 | Lee | ....................... | G11C 11/005 257/E21.672 |
| 7,679,963 B2 * | 3/2010 | Kakoschke | .............. | G11C 8/08 365/177 |
| 9,240,242 B1 * | 1/2016 | Lin | ........................ | G11C 16/14 |
| 2008/0049500 A1 * | 2/2008 | Kato | ........................ | G11C 8/10 365/185.05 |
| 2012/0039129 A1 * | 2/2012 | Lin | .................... | G11C 16/0441 365/185.18 |
| 2012/0039131 A1 * | 2/2012 | Lin | .................... | G11C 16/0416 365/185.27 |
| 2012/0051147 A1 * | 3/2012 | Lin | .................... | G11C 16/0416 365/185.29 |

* cited by examiner

*Primary Examiner* — Vu Le
*Assistant Examiner* — Sung Cho
(74) *Attorney, Agent, or Firm* — Rosenberg, Klein & Lee (57) ABSTRACT

A method for operating a small-area EEPROM array is disclosed. The small-area EEPROM array comprises bit lines, word lines, common source lines, and sub-memory arrays. The bit lines are divided into bit line groups. The word lines include a first word line. The common source lines include a first common source line. Each sub-memory array includes a first, second, third and fourth memory cells, which are connected with two bit line groups, a word line and a common source line. The first and second memory cells are symmetric. The third and fourth memory cells are symmetric. The group of the first and second memory cells and the group of the third and fourth memory cells are respectively positioned at two sides of the first common source line. The method operates all operation memory cells and uses special biases to program or erase memory cells massively in a single operation.

18 Claims, 11 Drawing Sheets

METHOD FOR OPERATING SMALL-AREA EEPROM ARRAY

BACKGROUND OF THE INVENTION

1. Filed of the Invention

The present invention relates to a memory array, particularly to a method for operating a low-cost EEPROM (Electrically Erasable Programmable Read Only Memory) array.

2. Description of the Related Art

The CMOS (Complementary Metal Oxide Semiconductor) technology has been a normal process for fabricating ASIC (Application Specific Integrated Circuit). Flash memories and EEPROM (Electrically Erasable Programmable Memory) have been widely used in electronic products because their data will not volatilize but can be erased and programmed electrically.

Figure 1:
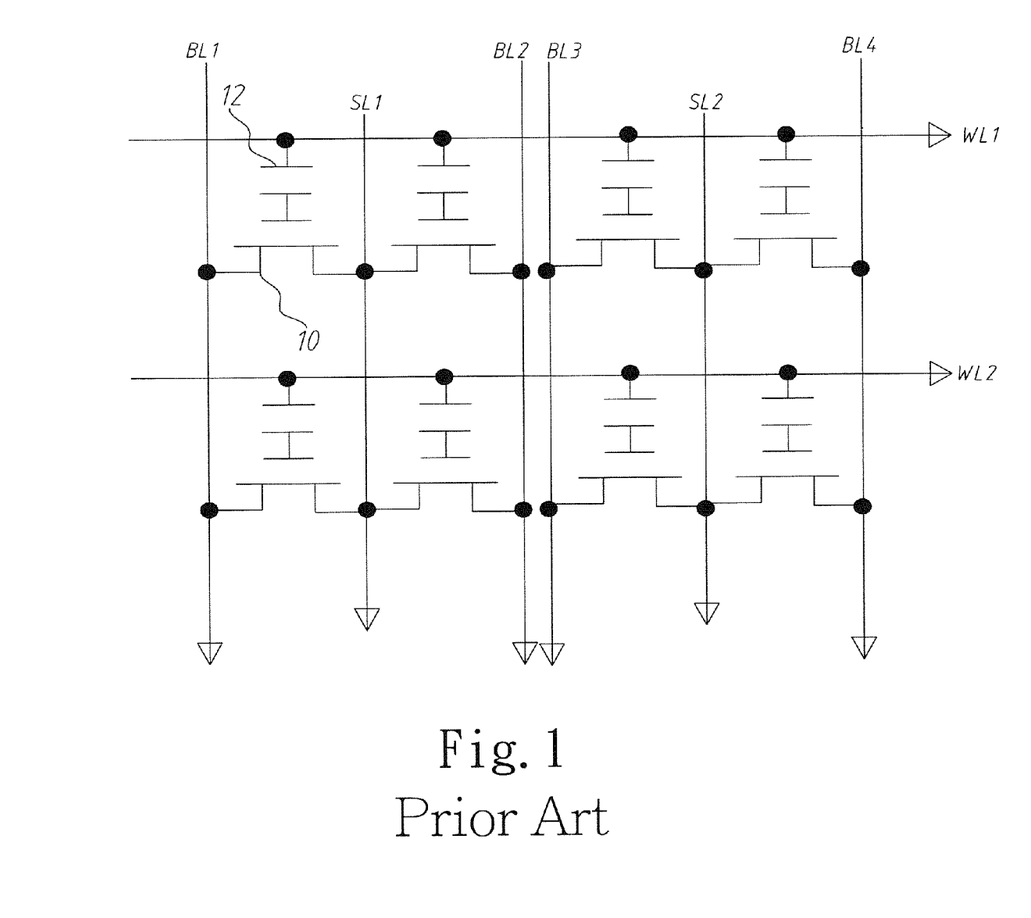
FIG. 1 schematically shows the circuit of a conventional non-volatile memory.
Figure 2:
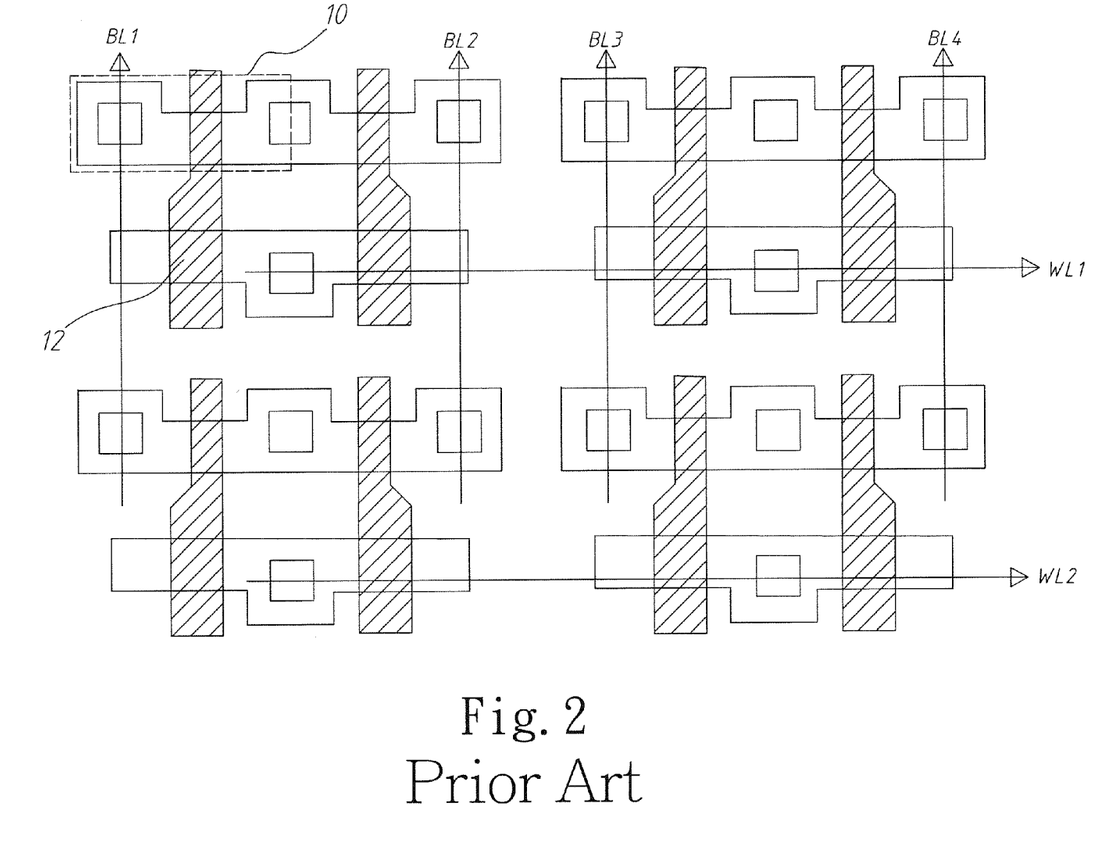
FIG. 2 schematically shows the layout of the circuit shown in FIG. 1.
Figure 3:
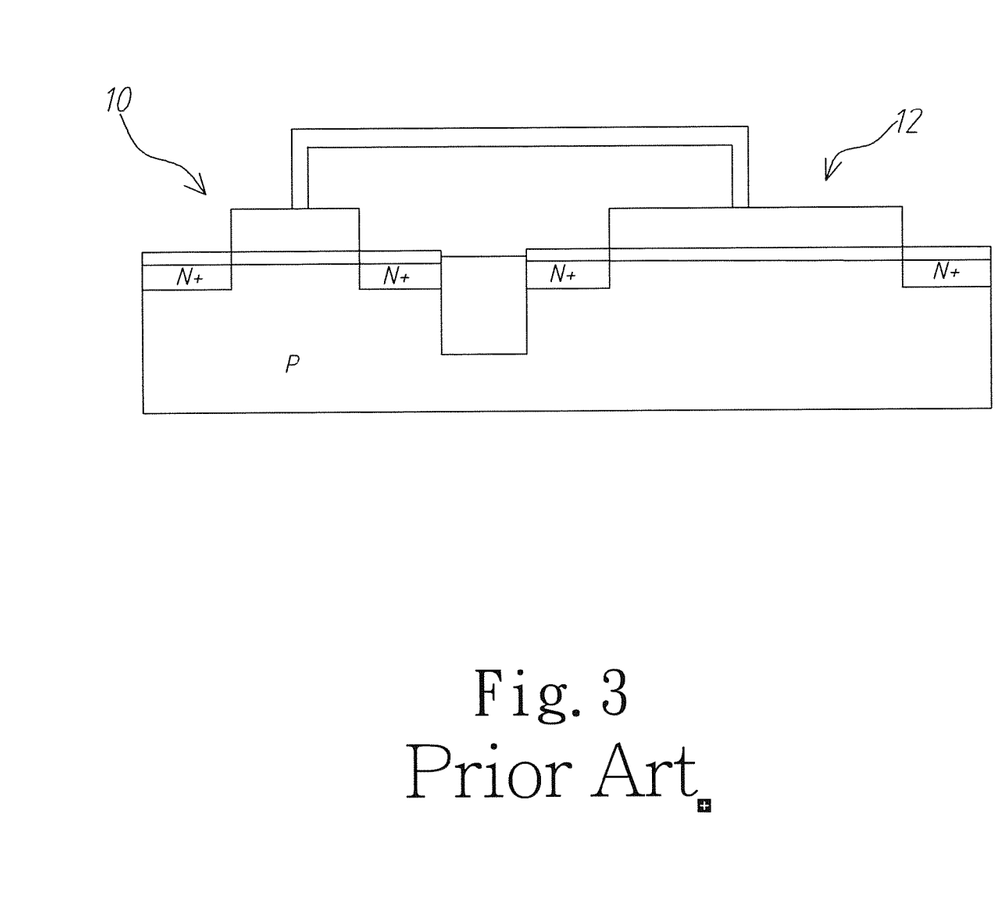
FIG. 3 schematically showing a sectional view of a memory cell of a conventional non-volatile memory.

Non-volatile memories are programmable, storing charges to vary gate voltages of transistors, or not storing charges to preserve the original gate voltages of transistors. In erasing a non-volatile memory, the charges stored in the non-volatile memory are eliminated to resume the initial state of the memory. Refer to FIG. 1 and FIG. 2 respectively schematically showing a circuit and a circuitry layout of a conventional non-volatile memory. As shown in FIG. 1 and FIG. 2, a non-volatile memory comprises a plurality of memory cells. Each memory includes a transistor 10 and a capacitor structure 12. Two bit lines are arranged between two neighboring one-bit memory cells. Thus, the area efficiency is reduced. Refer to FIG. 3 schematically showing a sectional view of a memory cell. As shown in FIG. 3, the capacitor structure 10 is disposed on one side of the transistor 10. Such a structure would occupies larger area and further reduce the area efficiency.

In order to overcome the abovementioned problems of the conventional technology, the Inventors develop a small-area EEPROM array and propose a method for operating the same in a low-current and low-voltage environment to massively program the memory cells of the same simultaneously.

SUMMARY OF THE INVENTION

The primary objective of the present invention is to provide a method for operating a small-area EEPROM (Electrically Erasable Programmable Read Only Memory) array, which uses a special bias method to massively program or erase memory cells of a low-cost small-area EEPROM array.

In order to achieve the abovementioned objective, the present invention proposes a method for operating a small-area EEPROM array, which is applied to a small-area EEPROM array. The small-area EEPROM array comprises a plurality of parallel bit lines, a plurality of parallel word lines; a plurality of parallel common source lines; and a plurality of sub-memory arrays. The bit lines are divided into a plurality of bit line groups, including a first bit line group and a second bit line group. The bit lines are vertical to the word lines. The word lines include a first word line and are parallel to the common source lines. The common source lines include a first common source line. Each of the sub-memory arrays is connected with two bit line groups, a word line and a common source line. Each sub-memory array contains a first memory cell, a second memory cell, a third memory cell and a fourth memory cell. The first memory cell is connected with the first bit line group, the first common source line and the first word line. The first memory cell is connected with the first bit line group, the first common source line and the first word line. The second memory cell is connected with the second bit line group, the first common source line and the first word line. The first memory cell and the second memory cell are arranged symmetrically and positioned at an identical side of the first common source line. The third memory cell is connected with the first bit line group, the first common source line and the first word line. The third memory cell and the first memory cell are symmetrically arranged with the first common source line being the symmetric axis. The fourth memory cell is connected with the second bit line group, the first common source line and the first word line. The fourth memory cell and the second memory cell are symmetrically arranged with the first common source line being the symmetric axis. The third memory cell and the fourth memory cell are arranged symmetrically. A first group consisting of the first and second memory cells and a second group consisting of the third and the fourth memory cells are respectively positioned at two different sides of the first common source line.

In one embodiment, each of the first, second, third, and fourth memory cells includes an N-type FET (Field-Effect Transistor) and functions as an operation memory cell. While all the operation memory cells are selected to operate, a substrate voltage $V_{sub}$ is applied to the operation memory cells through the P-type substrate or the P-type well that is connected with all the operation memory cells. The bit lines, the word lines and the common source lines, which are connected with all the operation memory cells, respectively apply a bit voltage $V_b$, a word voltage $V_w$ and a common source voltage $V_s$ to program or erase the operation memory cells. In writing, the following conditions must be satisfied: $V_{sub}$ is grounded, $V_s=V_b=0$, and $V_w=HV$ (High Voltage). In erasing, the following conditions must be satisfied: $V_{sub}$ is grounded, $V_s=V_b=HV$, and $V_w$ is floating.

In one embodiment, each of the first, second, third, and fourth memory cells includes a P-type FET and functions as an operation memory cell. While all the operation memory cells are selected to operate, a substrate voltage $V_{sub}$ is applied to the operation memory cells through the N-type substrate or the N-type well that is connected with all the operation memory cells. The bit lines, the word lines and the common source lines, which are connected with all the operation memory cells, respectively apply a bit voltage $V_b$, a word voltage $V_w$ and a common source voltage $V_s$ to program or erase the operation memory cells. In writing, the following conditions must be satisfied: $V_{sub}=HV$, $V_s=V_b=HV$, and $V=0$. In erasing, the following conditions must be satisfied: $V_{sub}=HV$, $V_s=V_b=0$, and $V_w$ is floating.

Below, embodiments are described in detail in cooperation with the attached drawings to make easily understood the objectives, technical contents, characteristics and accomplishments of the present invention.

DETAILED DESCRIPTION OF THE INVENTION

Figure 4:
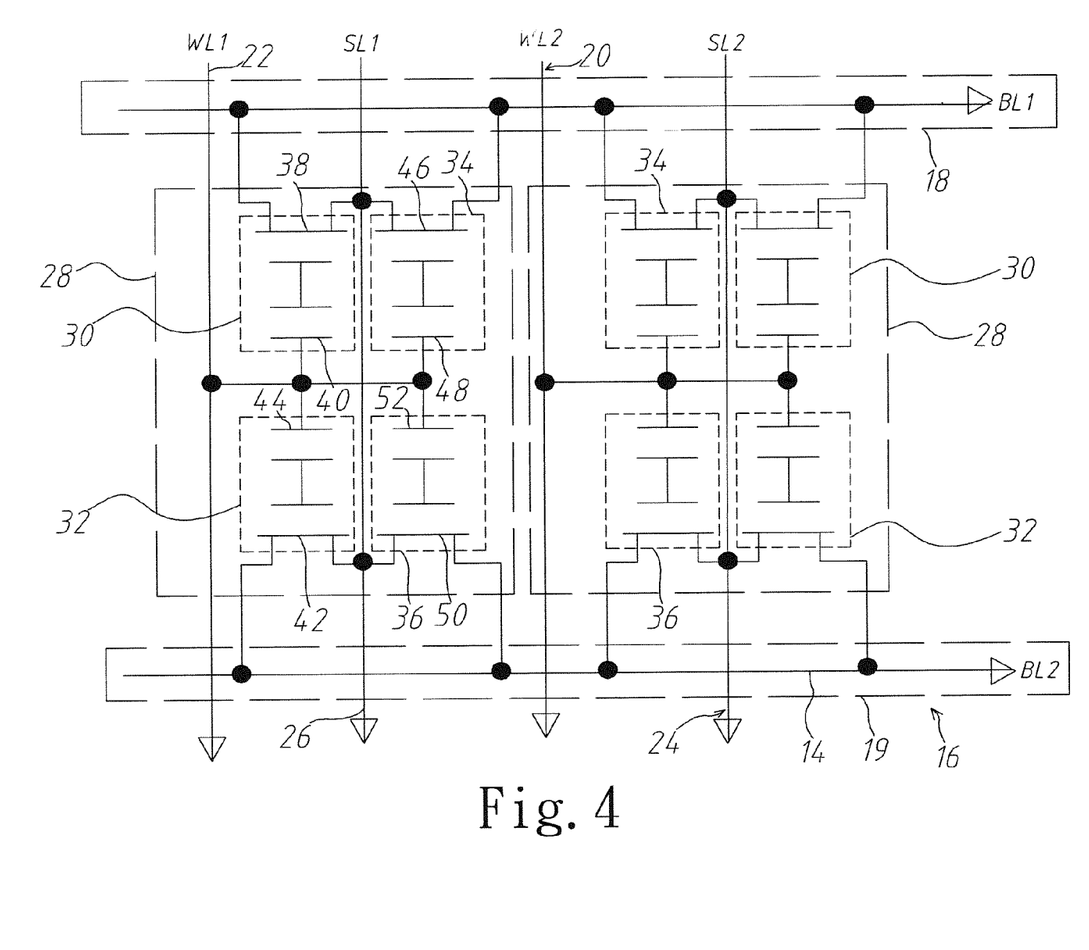
FIG. 4 schematically shows the circuit of a small-area EEPROM array according to a first embodiment of the present invention.
Figure 5:
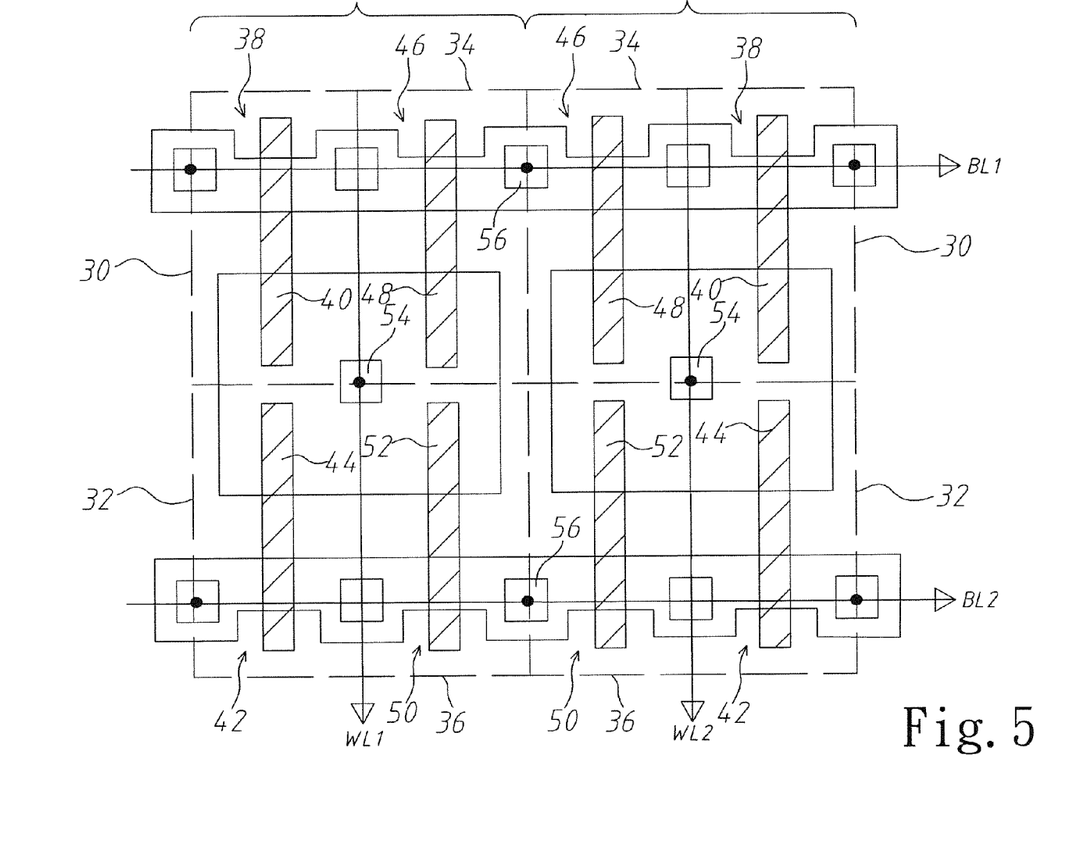
FIG. 5 schematically shows the layout of the circuit of a small-area EEPROM array according to the first embodiment of the present invention.

Refer to FIG. 4 and FIG. 5 for a first embodiment of the present invention. The method for operating a small-area EEPROM array is applied to a small-area EEPROM array. The small-area EEPROM array comprises a plurality of parallel bit lines 14; a plurality of parallel word lines 20; a plurality of parallel common source lines 24; and a plurality of sub-memory arrays 28. The bit lines 14 are divided into a plurality of bit line groups 16, including a first bit line group 18 and a second bit line group 19. Each of the first bit line group 18 and the second bit line group 19 includes a bit line 14. The word lines 20 are vertical to the bit lines 14 and include a first word line 22. The common source lines 24 are parallel to the word lines 20 and include a first common source line 26. The bit lines 14, the word lines 20 and the common source lines 24 are connected with sub-memory arrays 28 each containing 2×2 pieces of one-bit memory cells. Each sub-memory array 28 is connected with two bit line groups 16, one word lines 20 and one common source line 24. Each sub-memory array 28 is arranged between two adjacent two bit line groups 16. The connections of the sub-memory arrays 30 with the bit lines 14, the word lines 20 and the common source lines 26 are similar. The common characteristics of the connections are described below.

Figure 6:
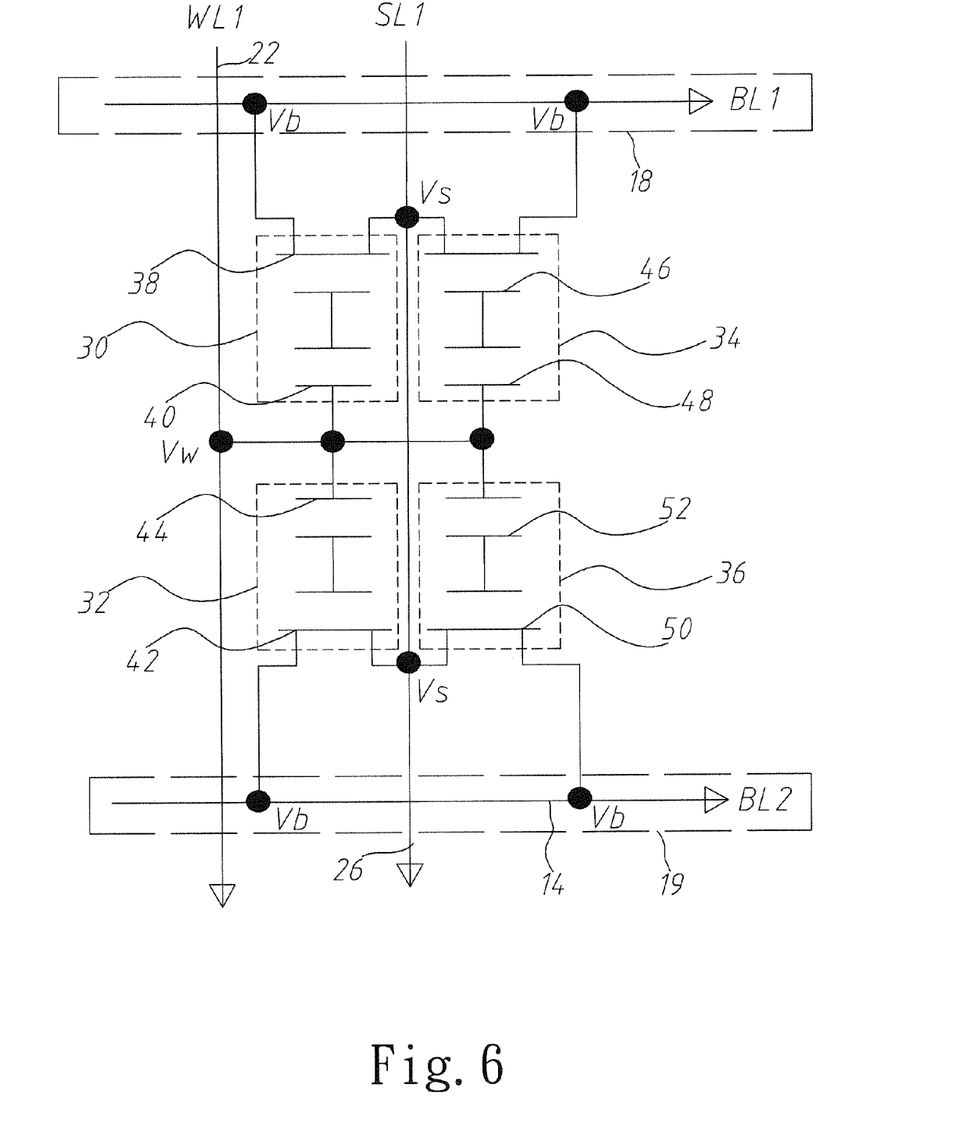
FIG. 6 schematically shows the circuit of a sub-memory array of a small-area EEPROM array according to the first embodiment of the present invention.

Refer to FIG. 5 and FIG. 6. Each sub-memory array 28 includes a first memory cell 30, a second memory cell 32, a third memory cell 34 and a fourth memory cell 36 and is arranged between the first bit line group 18 and the second bit line group 19. The first memory cell 30 is connected with the bit line 14 of the first bit line group 18, the first common source line 26 and the first word line 22. The second memory cell 32 is connected with the bit line 14 of the second bit line group 19, the first common source line 26 and the first word line 22. The first memory cell 30 and the second memory cell 32 are arranged symmetrically and positioned at an identical side of the first common source line 26. The third memory cell 34 is connected with the bit line 14 of the first bit line group 18, the first common source line 26 and the first word line 22. The third memory cell 34 and the first memory cell 30 are symmetrically arranged with the first common source line 26 being the symmetric axis. The fourth memory cell 36 is connected with the bit line 14 of the second bit line group 19, the first common source line 26 and the first word line 22. The fourth memory cell 36 and the second memory cell 32 are symmetrically arranged with the first common source line 26 being the symmetric axis. The third memory cell 34 and the fourth memory cell 36 are arranged symmetrically. A first group consisting of the first and second memory cells 30 and 32 and a second group consisting of the third and the fourth memory cells 34 and 36 are respectively positioned at two different sides of the first common source line 26.

The first, second, third, and fourth memory cells 30, 32, 34 and 36 are disposed symmetrically and jointly connected with the first word line 22, thus sharing a common contact at the first word line 22. Two third memory cells 34 of two adjacent sub-memory arrays 28 are neighboring and share a common bit line 14 and a common contact. Two fourth memory cells 36 of two adjacent sub-memory arrays 28 are also neighboring and share a common bit line 14 and a common contact. Thereby, the area of the overall layout is reduced.

The first memory cell 30 further includes an FET 38 (Field Effect Transistor) and a capacitor 40. The FET 38 has a conduction gate, a drain connected with the bit line 14 of the first bit line group 18, and a source connected with the first common source line 26. The conduction gate and the capacitor 40 are made of polysilicon. A bias $V_w$ of the first word line 22 is coupled to the FET 38 via the capacitor 40. The FET 38 receives a bias $V_b$ from the bit line 14 of the first bit line group 18 and receives a bias $V_s$ from the first common source line 26 so as to write data into or erase data from the conduction gate of the FET 38.

The second memory cell 32 further includes an FET 42 and a capacitor 44. The FET 42 has a conduction gate, a drain connected with the bit line 14 of the second bit line group 19, and a source connected with the first common source line 26. The conduction gate and the capacitor 44 are made of polysilicon. A bias $V_w$ of the first word line 22 is coupled to the FET 42 via the capacitor 44. The capacitor 44 and the capacitor 42 are directly connected with each other and disposed between the FET 38 and the FET 42. The FET 42 receives a bias $V_b$ from the bit line 14 of the second bit line group 19 and receives a bias $V_s$ from the first common source line 26 so as to write data into or erase data from the conduction gate of the FET 42.

The third memory cell 34 further includes an FET 46 and a capacitor 48. The FET 46 has a conduction gate, a drain connected with the bit line 14 of the first bit line group 18, and a source connected with the first common source line 26. The third memory cell 34 and the first memory cell 30 share a common contact. The capacitor 48 and the FET 46 are respectively symmetrically arranged corresponding to the capacitor 40 and the FET 38 with the first common source line 26 being the symmetric axis. The conduction gate and the capacitor 48 are made of polysilicon. A bias $V_w$ of the first word line 22 is coupled to the FET 46 via the capacitor 48. The FET 46 receives a bias $V_b$ from the bit line 14 of the first bit line group 18 and receives a bias $V_s$ from the first common source line 26 so as to write data into or erase data from the conduction gate of the FET 46.

The fourth memory cell 36 further includes an FET 50 and a capacitor 52. The FET 50 has a conduction gate, a drain connected with the bit line 14 of the second bit line group 19, and a source connected with the first common source line 26. The fourth 36 memory cell 34 and the second memory cell 32 share a common contact. The capacitor 52 and the FET 50 are respectively symmetrically arranged corresponding to the capacitor 44 and the FET 42 with the first common source line 26 being the symmetric axis. The conduction gate and the capacitor 52 are made of polysilicon. A bias $V_w$ of the first word line 22 is coupled to the FET 50 via the capacitor 52. The capacitor 52 and the capacitor 48 are directly connected with each other and disposed between the FET 50 and the FET 46. The FET 50 receives a bias $V_b$ from the bit line 14 of the second bit line group 19 and receives a bias $V_s$ from the first common source line 26 so as to write data into or erase data from the conduction gate of the FET 50.

Since the capacitors 40, 44, 48 and 52 are all connected with the first word line 22, they can share a common gate contact 54 via the first word line 22. In two adjacent sub-memory arrays 28, two FETs 46 are neighboring and share a common bit line 14 and a common drain contact 56; two FETs 50 are neighboring and share a common bit line 14 and a common drain contact 56. Via sharing the common contacts, the present invention can reduce the layout area and effectively decrease the fabrication cost.

Refer to FIG. 4 again. The FETs 38, 42, 46 and 50 are all N-type FETs built in a P-type substrate or a P-type well. Alternatively, The FETs 38, 42, 46 and 50 are all P-type FETs built in an N-type substrate or an N-type well. The method for operating a small-area EEPROM array has different sub-embodiments with respect to the types of FETs. Below, the sub-embodiment corresponding to the N-type FETs 38, 42, 46 and 50 is described firstly.

The abovementioned first, second, third and fourth memory cells 30, 32, 34 and 36 are operation memory cells. The present invention operates all the operation memory cells to execute writing or erasing. In the first embodiment, the following operating method can simultaneously program a great quantity of memory cells in a low-voltage and low-current condition.

A substrate voltage $V_{sub}$ is applied to the P-type substrate or the P-type well, which is connected with all the operation memory cells. A bit voltage $V_b$, a word voltage $V_w$ and a common source voltage $V_s$ are respectively applied to all the bit lines 14, word lines 20 and common source lines 24, which are connected with all the operation memory cells. In writing, the following conditions must be satisfied: $V_{sub}$ is grounded, $V_s=V_b=0$, and $V_w$=HV (High Voltage). In erasing, the following conditions must be satisfied: $V_{sub}$ is grounded, Vs=$V_b$=HV, and $V_w$ is floating.

While the FETs 38, 42, 46 and 50 are all P-type FETs built in an N-type substrate or an N-type well, a substrate voltage $V_b$ is applied to the N-type substrate or the N-type well. In writing, the following conditions must be satisfied: $V_{sub}$=HV, $V_s=V_b$=HV, and $V_w$=0. In erasing, the following conditions must be satisfied: $V_{sub}$=HV, $V_s=V_b$=0, and $V_w$ is floating. Herein, the voltage symbols have the same definitions as those used above.

In an identical sub-memory array 28, two memory cells are connected with an identical bit line 14 and thus both programmed or erased simultaneously. The abovementioned bias method can realize "byte write" and "byte erase" for the non-volatile memory in an environment free of extrinsic insulating transistors.

Figure 7:
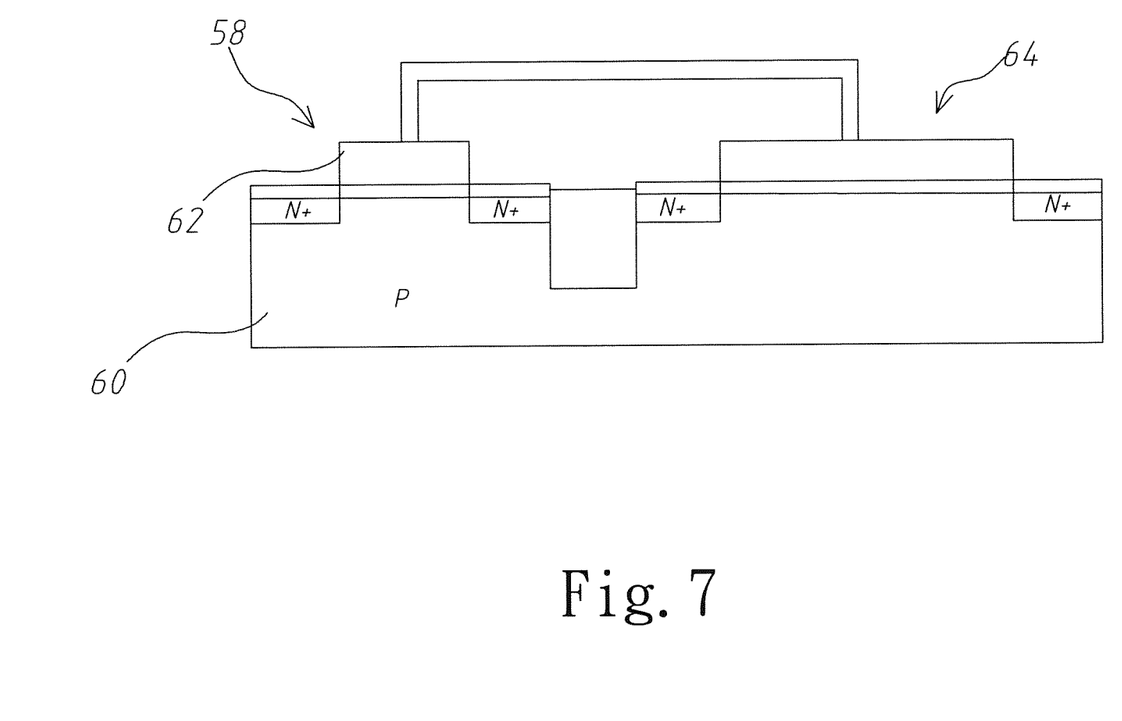
FIG. 7 schematically shows a sectional view of an N-type FET and a capacitor of a memory cell according to one embodiment of the present invention.

The structures of the FETs 38, 42, 46 and 50 and the capacitors 40, 44, 48 and 52 are described below. Refer to FIG. 7, wherein an N-type FET 58 is used to exemplify the FETs 38, 42, 46 and 50. The N-type FET 58 is formed in a P-type semiconductor substrate 60 and has a conduction gate 62. A capacitor 64 is also formed in the P-type semiconductor substrate 60 and disposed beside the N-type FET 58. The capacitor 64 and the conduction gate 62 are made of an identical polysilicon. If the semiconductor substrate is an N-type semiconductor substrate, a P-type well is formed in the N-type semiconductor substrate. Then, the N-type FET 58 is formed in the P-type well.

Figure 8:
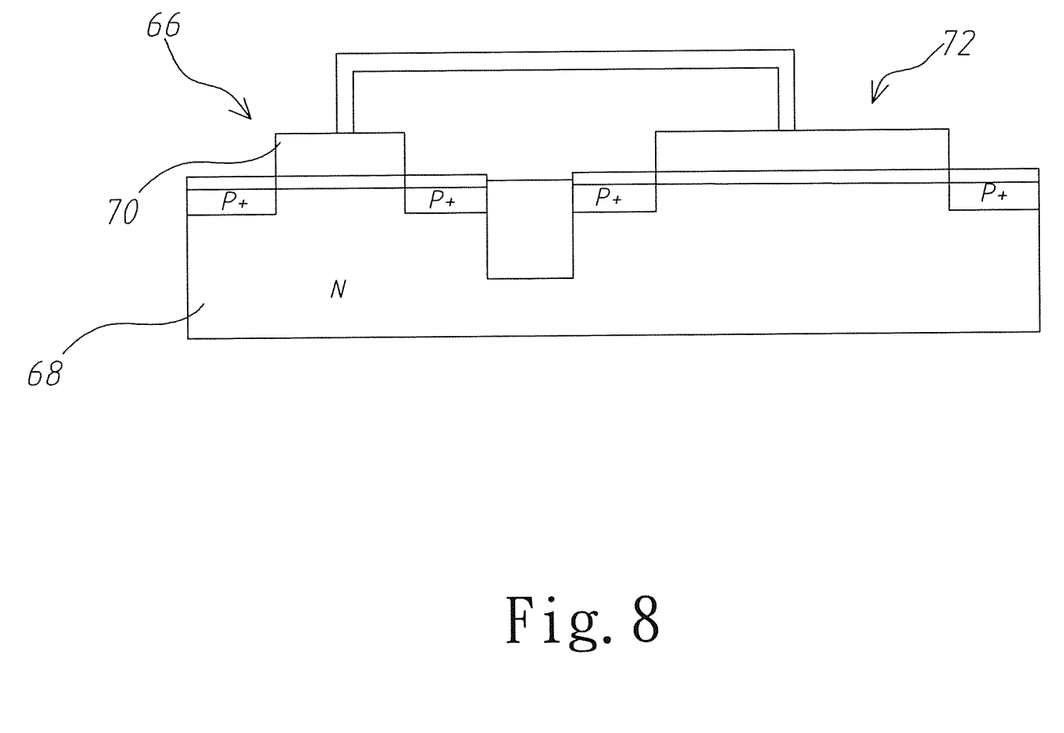
FIG. 8 schematically shows a sectional view of a P-type FET and a capacitor of a memory cell according to one embodiment of the present invention.

Refer to FIG. 8, wherein a P-type FET 66 is used to exemplify the FETs 38, 42, 46 and 50. The P-type FET 66 is formed in an N-type semiconductor substrate 68 and has a conduction gate 70. A capacitor 72 is also formed in the P-type semiconductor substrate 68 and disposed beside the N-type FET 66. The capacitor 72 and the conduction gate 70 are made of an identical polysilicon. If the semiconductor substrate is a P-type semiconductor substrate, an N-type well is formed in the P-type semiconductor substrate. Then, the P-type FET 66 is formed in the N-type well.

Figure 9:
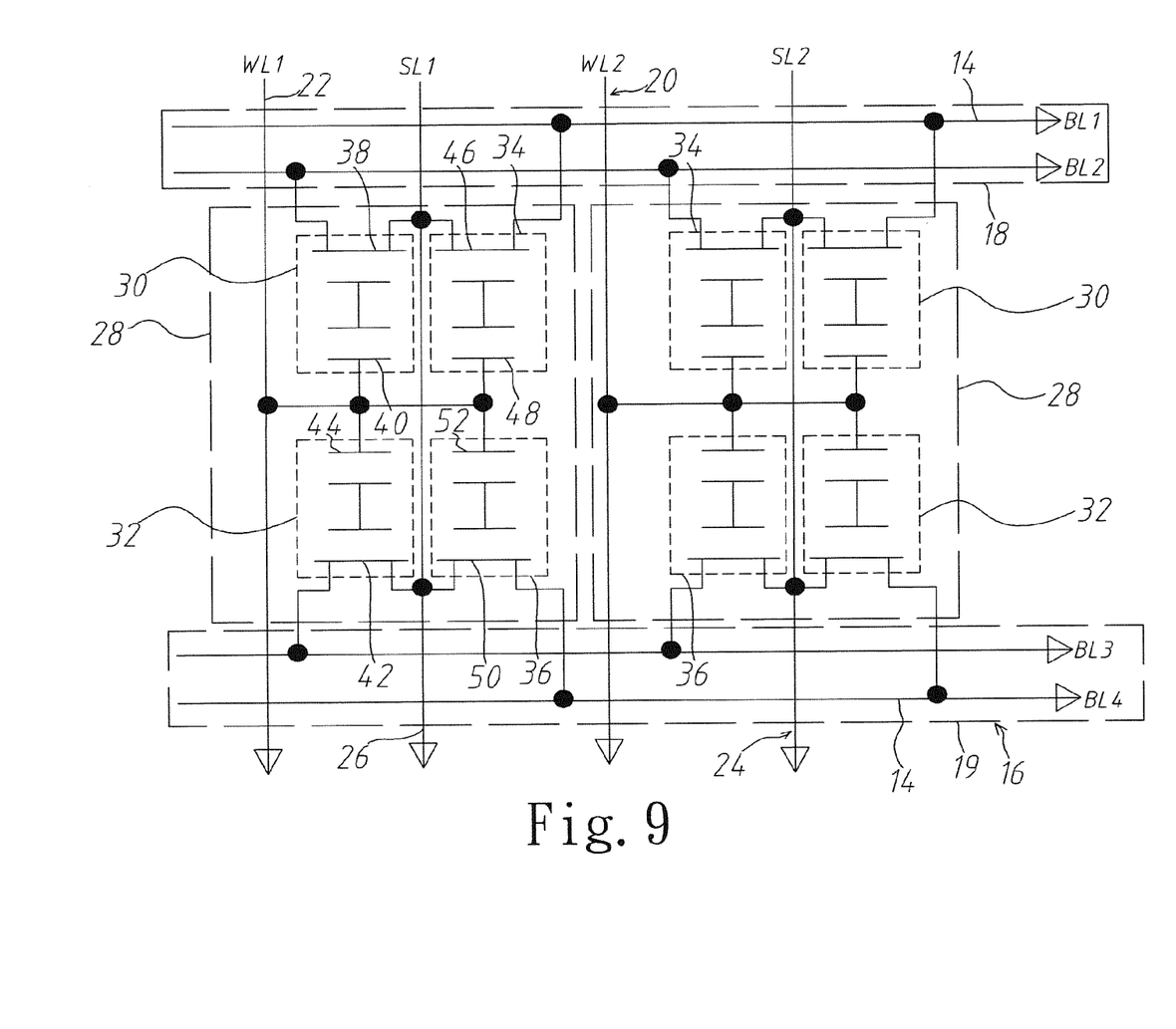
FIG. 9 schematically shows the circuit of a small-area EEPROM array according to a second embodiment of the present invention.
Figure 10:
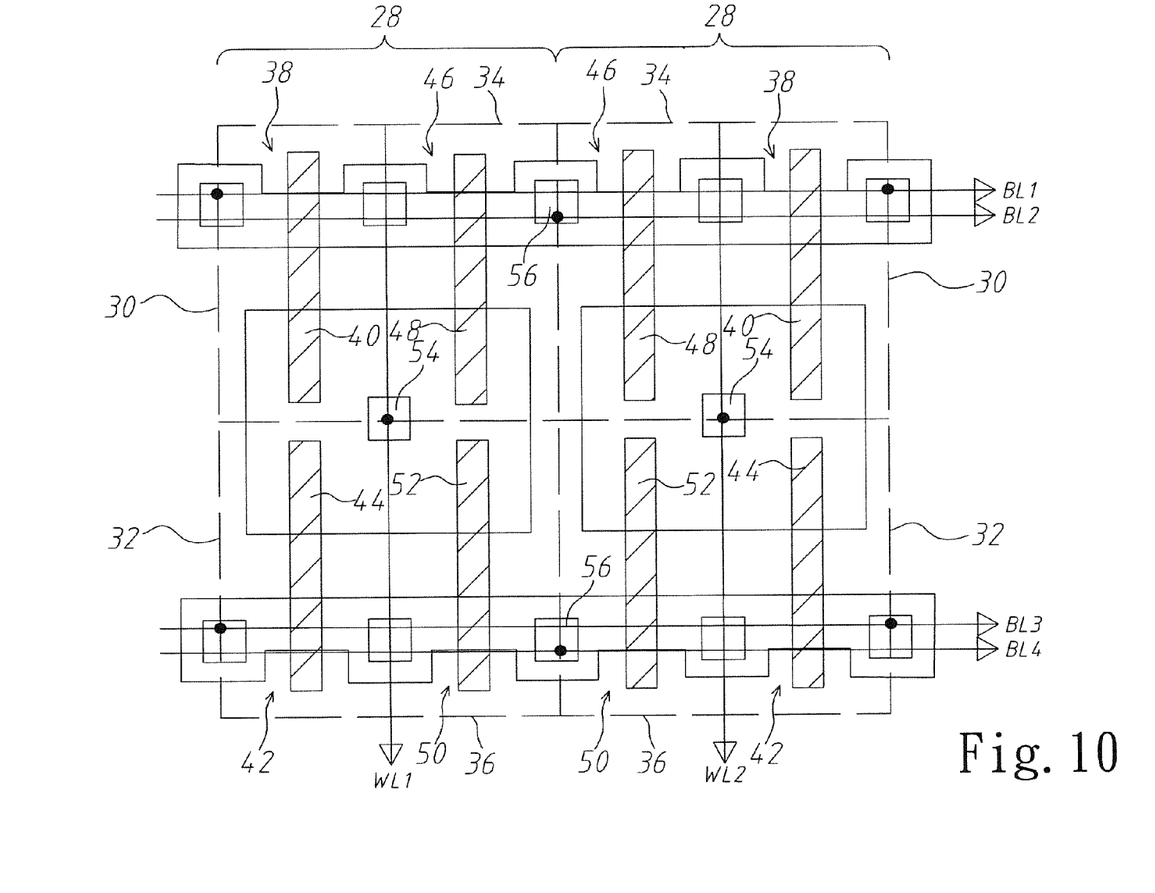
FIG. 10 schematically shows the layout of the circuit of a small-area EEPROM array according to the second embodiment of the present invention.
Figure 11:
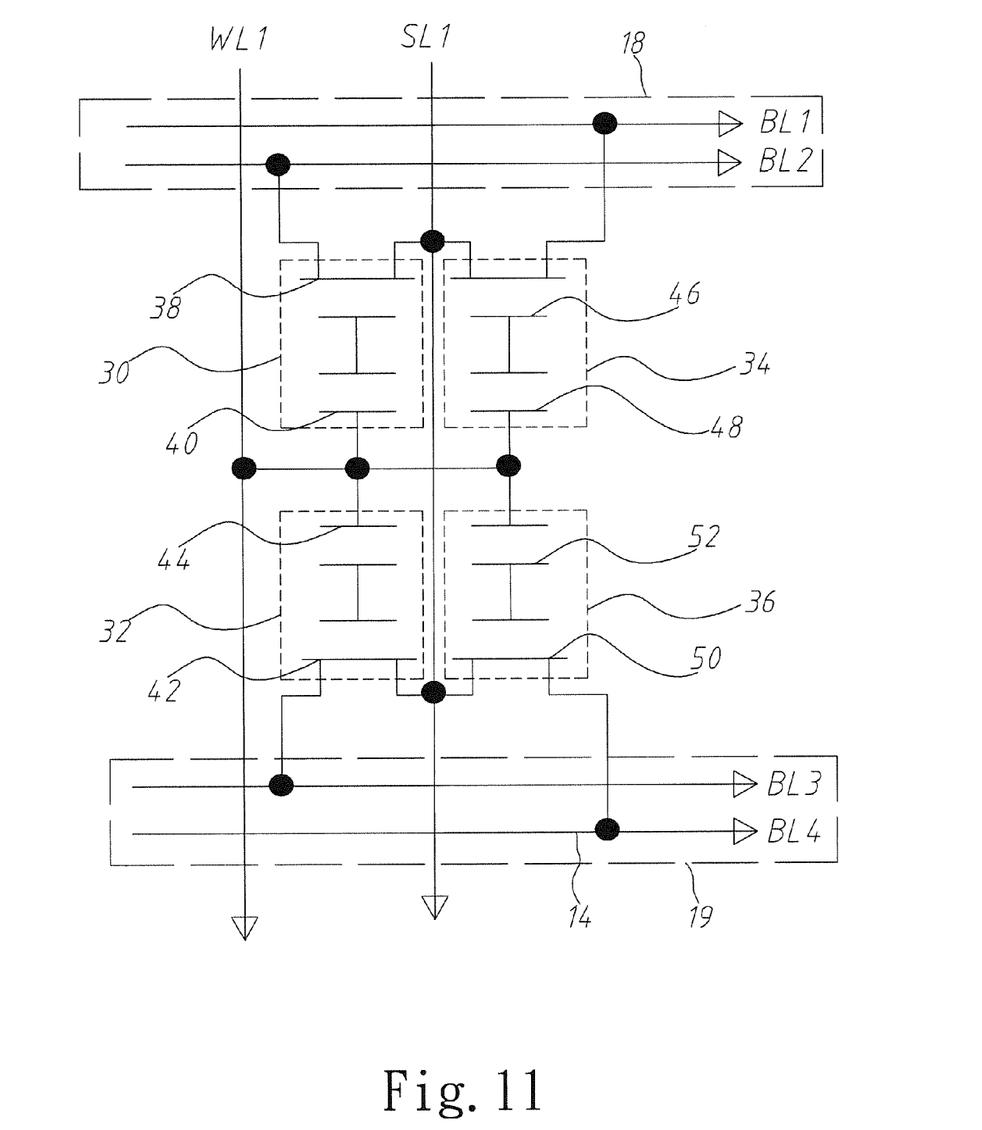
FIG. 11 schematically shows the circuit of a sub-memory array of a small-area EEPROM array according to the second embodiment of the present invention.

Refer to FIGS. 9-11 for a second embodiment of the present invention. The second embodiment is different from the first embodiment in that each bit line group 16 includes two bit lines 14. Therefore, the first bit line group 18 also includes two bit lines 14, which are respectively connected with the first memory cell 30 and the third memory cell 34 of the same sub-memory array 28; the first bit line group 19 also includes two bit lines 14, which are respectively connected with the second memory cell 32 and the fourth memory cell 36 of the same sub-memory array 28. In the second embodiment, two third memory cells 34 of two adjacent sub-memory arrays 28 are neighboring and share a common bit line 14 and a common contact; two fourth memory cells 36 of two adjacent sub-memory arrays 28 are neighboring and share a common bit line 14 and a common contact. In other words, the FETs 46 of two third memory cells 34 are neighboring and share a common bit line 14 and a common drain contact 56; the FETs 50 of two fourth memory cells 36 are neighboring and share a common bit line 14 and a common drain contact 56. Thereby, the area of the overall layout of the circuit is reduced.

Refer to FIG. 9 again. The FETs 38, 42, 46 and 50 are all N-type FETs built in a P-type substrate or a P-type well. Alternatively, the FETs 38, 42, 46 and 50 are all P-type FETs built in an N-type substrate or an N-type well. The method for operating a small-area EEPROM array has different sub-embodiments with respect to the types of FETs. Below, the sub-embodiment corresponding to the N-type FETs 38, 42, 46 and 50 is described firstly.

All the abovementioned first, second, third and fourth memory cells 30, 32, 34 and 36 function as operation memory cells. The present invention operates all the operation memory cells to execute writing or erasing. In the second embodiment, the following operating method can simultaneously program a great quantity of memory cells in a low-voltage and low-current condition.

A substrate voltage $V_{sub}$ is applied to the P-type substrate or the P-type well, which is connected with all the operation memory cells. A bit voltage $V_b$, a word voltage $V_w$ and a common source voltage $V_s$ are respectively applied to all the bit lines 14, word lines 20 and the common source lines 24, which are connected with all the operation memory cells. In writing, the following conditions must be satisfied: $V_b$ is grounded, $V_s=V_b$=0, and $V_w$=HV (High Voltage). In erasing, the following conditions must be satisfied: $V_{sub}$ is grounded, Vs=$V_b$=HV, and is floating.

While The FETs 38, 42, 46 and 50 are all P-type FETs, a substrate voltage $V_{sub}$ is applied to the N-type substrate or the N-type well. In writing, the following conditions must be satisfied: $V_{sub}$=HV, $V_s=V_b$=HV, and $V_w$=0. In erasing, the following conditions must be satisfied: $V_{sub}$=HV, $V_s=V_b$=0, and $V_w$ is floating. Herein, the voltage symbols have the same definitions as those used above.

The abovementioned bias method can realize "byte write" and "byte erase" for the non-volatile memory in an environment free of extrinsic insulating transistors.

A charge pump converts a lower-voltage supply of 2.5V or 3.3V into a stable higher-voltage supply for programming the memory cells. However, the potential drop between the drain and the source generates a current and thus causes fluctuation of the high voltage. The more intense the current, the greater the fluctuation of the high voltage, and the more powerful the charge pump required. A more power charge pump would occupy a larger area. Normally, a flash memory architecture undertakes programming in the bias method: a high voltage is applied to the gate capacitor and the drain, and the source is grounded, with a current of 500 µA/bit between the drain and the source. In programming all the memory cells, the present invention applies a high voltage to the gate capacitor. In erasing, the present invention applies high voltages to the source and the drain. The high voltages applied to the source and the drain are respectively 9V and 7V, wherein the system respectively boosts a voltage of 5V and a voltage of 3.5V to a voltage of 9V and a voltage of 7V, which are much lower than the withstanding voltage of the transistors. Via the abovementioned bias conditions, the present invention can erase all the memory cells in a single operation and can also program all the memory cells in a single operation, without any load. Therefore, the present invention can use smaller charge pumps and achieve higher efficiency.

The structures of the FETs 38, 42, 46 and 50 and the capacitors 40, 44, 48 and 52 of the second embodiments are the same as those of the first embodiment and will not repeat herein.

In conclusion, the method of the present invention can uses the bias conditions to program or erase all the memory cells in a single operation and thus can massively program memory cells for a small-area and low-cost EEPROM array.

The present invention has been demonstrated in detail with the abovementioned embodiments. However, it should be noted: these embodiments are only to exemplify the present invention but not to limit the scope of the present invention. Any equivalent modification or variation according to the shapes, structures, characteristics and principles disclosed in the specification is to be also included within the scope of the present invention.

What is claimed is:

1. A method for operating a small-area electrically erasable programmable read only memory array, wherein said small-area electrically erasable programmable read only memory (EEPROM) array comprises a plurality of parallel bit lines; a plurality of parallel word lines; a plurality of parallel common source lines; and a plurality of sub-memory arrays, and wherein said bit lines are divided into a plurality of bit line groups including a first bit line group and a second bit line group, and wherein said word lines are vertical to said bit lines and include a first word line, and wherein said common source lines are parallel to said word lines and include a first common source line, and wherein each said sub-memory array is connected with two said bit line groups, one said word line and one said common source line, and wherein each said sub-memory array includes a first memory cell, a second memory cell, a third memory cell and a fourth memory cell, and wherein said first memory cell is connected with said first bit line group, said first common source line and said first word line, and wherein said second memory cell is connected with said second bit line group, said first common source line and said first word line, and wherein said first memory cell and said second memory cell are arranged symmetrically and disposed at an identical side of said first common source line, and wherein said third memory cell is connected with said first bit line group, said first common source line and said first word line, and wherein said third memory cell and said first memory cell are symmetrically arranged with said first common source line being a symmetric axis, and wherein said fourth memory cell is connected with said second bit line group, said first common source line and said first word line, and wherein said fourth memory cell and said second memory cell are symmetrically arranged with said first common source line being a symmetric axis, and wherein said fourth memory cell said third memory cell are symmetrically arranged, and wherein a first group consisting of said first memory cell and said second memory cell and a second group consisting of said third memory cell and said fourth memory cell are respectively arranged at two different sides of said first common source line, and wherein each of said first memory cell, said second memory cell, said third memory cell and said fourth memory cell includes an N-type field-effect transistor (FET) formed in a P-type substrate or a P-type well, and wherein said first memory cell, said second memory cell, said third memory cell and said fourth memory cell all function as operation memory cells, and wherein in operating all said operation memory cells, said method is characterized in that a substrate voltage $V_{sub}$ is applied to said P-type substrate or said P-type well, which is connected with all said operation memory cells, and that a bit voltage $V_b$, a word voltage $V_w$ and a common source voltage $V_s$ are respectively applied to all said bit lines, said word lines and said common source lines, which are connected with all said operation memory cells, wherein the common source voltage $V_s$ and the bit voltage $V_b$ are equal to one another in both writing and erasing operations, and that in writing, following conditions must be satisfied:

$V_{sub}$ is grounded, $V_s=V_b=0$, and $V_w$=HV (High Voltage); and that in erasing, following conditions must be satisfied:

$V_{sub}$ is grounded, $V_s=V_b$=HV, and $V_w$ is floating.

2. The method for operating a small-area electrically erasable programmable read only memory array according to claim 1, wherein each said sub-memory array is arranged between two adjacent said bit line groups.

3. The method for operating a small-area electrically erasable programmable read only memory array according to claim 1, wherein said first memory cell, said second memory cell, said third memory cell and said fourth memory cell are all connected with said first word line and share a common contact.

4. The method for operating a small-area electrically erasable programmable read only memory array according to claim 1, wherein said first bit line group includes one said bit line connected with said first memory cell and said third memory cell, and wherein said second bit line group includes one said bit line connected with said second memory cell and said fourth memory cell, wherein in two adjacent said sub-memory arrays, two said third memory cells are neighboring and connected with an identical said bit line to share a common contact; said second memory cell and said fourth memory cell are neighboring and connected with an identical said bit line to share a common contact.

5. The method for operating a small-area electrically erasable programmable read only memory array according to claim 1, wherein said first bit line group includes two said bit lines respectively connected with said first memory cell and said third memory cell, and wherein said second bit line group includes two said bit lines respectively connected with said second memory cell and said fourth memory cell, wherein in two adjacent said sub-memory arrays, two said third memory cells are neighboring and connected with an identical said bit line to share a common contact; said second memory cell and said fourth memory cell are neighboring and connected with an identical said bit line to share a common contact.

6. The method for operating a small-area electrically erasable programmable read only memory array according to claim 1, wherein said N-type FET of said first memory cell has a conduction gate, a drain connected with said first bit line group, and a source connected with said first common source line, and wherein a bias of said first word line is coupled to said N-type FET via a capacitor, and wherein said conduction gate of said N-type FET and said capacitor are made of an identical polysilicon, and wherein said N-type FET receives a bias of said first bit line group and a bias of said common source line to write data into or erase data from said conduction gate, wherein said N-type FET and said capacitor are horizontally formed in a semiconductor substrate.

7. The method for operating a small-area electrically erasable programmable read only memory array according to claim 1, wherein said N-type FET of said second memory cell has a conduction gate, a drain connected with said second bit line group, and a source connected with said first common source line, and wherein a bias of said first word line is coupled to said N-type FET via a capacitor, and wherein said conduction gate of said N-type FET and said capacitor are made of an identical polysilicon, and wherein said N-type FET receives a bias of said second bit line group and a bias of said common source line to write data into or erase data from said conduction gate, wherein said N-type FET and said capacitor are horizontally formed in a semiconductor substrate.

8. The method for operating a small-area electrically erasable programmable read only memory array according to claim 1, wherein said N-type FET of said third memory cell has a conduction gate, a drain connected with said first bit line group, and a source connected with said first common source line, and wherein a bias of said first word line is coupled to said N-type FET via a capacitor, and wherein said conduction gate of said N-type FET and said capacitor are made of an identical polysilicon, and wherein said N-type FET receives a bias of said first bit line group and a bias of said common source line to write data into or erase data from said conduction gate, wherein said N-type FET and said capacitor are horizontally formed in a semiconductor substrate.

9. The method for operating a small-area electrically erasable programmable read only memory array according to claim 1, wherein said N-type FET of said fourth memory cell has a conduction gate, a drain connected with said second bit line group, and a source connected with said first common source line, and wherein a bias of said first word line is coupled to said N-type FET via a capacitor, and wherein said conduction gate of said N-type FET and said capacitor are made of an identical polysilicon, and wherein said N-type FET receives a bias of said second bit line group and a bias of said common source line to write data into or erase data from said conduction gate, wherein said N-type FET and said capacitor are horizontally formed in a semiconductor substrate.

10. A method for operating a small-area electrically erasable programmable read only memory array, wherein said small-area electrically erasable programmable read only memory (EEPROM) array comprises a plurality of parallel bit lines; a plurality of parallel word lines; a plurality of parallel common source lines; and a plurality of sub-memory arrays, and wherein said bit lines are divided into a plurality of bit line groups including a first bit line group and a second bit line group, and wherein said word lines are vertical to said bit lines and include a first word line, and wherein said common source lines are parallel to said word lines and include a first common source line, and wherein each said sub-memory array is connected with two said bit line groups, one said word line and one said common source line, and wherein each said sub-memory array includes a first memory cell, a second memory cell, a third memory cell and a fourth memory cell, and wherein said first memory cell is connected with said first bit line group, said first common source line and said first word line, and wherein said second memory cell is connected with said second bit line group, said first common source line and said first word line, and wherein said first memory cell and said second memory cell are arranged symmetrically and disposed at an identical side of said first common source line, and wherein said third memory cell is connected with said first bit line group, said first common source line and said first word line, and wherein said third memory cell and said first memory cell are symmetrically arranged with said first common source line being a symmetric axis, and wherein said fourth memory cell is connected with said second bit line group, said first common source line and said first word line, and wherein said fourth memory cell and said second memory cell are symmetrically arranged with said first common source line being a symmetric axis, and wherein said fourth memory cell said third memory cell are symmetrically arranged, and wherein a first group consisting of said first memory cell and said second memory cell and a second group consisting of said third memory cell and said fourth memory cell are respectively arranged at two different sides of said first common source line, and wherein each of said first memory cell, said second memory cell, said third memory cell and said fourth memory cell includes a P-type field-effect transistor (FET) formed in an N-type substrate or an N-type well, and wherein said first memory cell, said second memory cell, said third memory cell and said fourth memory cell all function as operation memory cells, and wherein in operating all said operation memory cells, said method is characterized in that a substrate voltage $V_{sub}$ is applied to said N-type substrate or said N-type well, which is connected with all said operation memory cells, and that a bit voltage $V_b$, a word voltage $V_w$ and a common source voltage $V_s$ are respectively applied to all said bit lines, said word lines and said common source lines, which are connected with all said operation memory cells, wherein the common source voltage $V_s$ and the bit voltage $V_b$ are equal to one another in both writing and erasing operations, and that in writing, following conditions must be satisfied:

$V_{sub}$=HV (High Voltage), $V_s$=$V_b$=HV, and $V_w$=0; and that in erasing, following conditions must be satisfied:

$V_{sub}$=HV, $V_s$=$V_b$=0, and $V_w$ is floating.

11. The method for operating a small-area electrically erasable programmable read only memory array according to claim 10, wherein each said sub-memory array is arranged between two adjacent said bit line groups.

12. The method for operating a small-area electrically erasable programmable read only memory array according to claim 10, wherein said first memory cell, said second memory cell, said third memory cell and said fourth memory cell are all connected with said first word line and share a common contact.

13. The method for operating a small-area electrically erasable programmable read only memory array according to claim 10, wherein said first bit line group includes one said bit line connected with said first memory cell and said third memory cell, and wherein said second bit line group includes one said bit line connected with said second memory cell and said fourth memory cell, wherein in two adjacent said sub-memory arrays, two said third memory cells are neighboring and connected with an identical said bit line to share a common contact; said second memory cell and said fourth memory cell are neighboring and connected with an identical said bit line to share a common contact.

14. The method for operating a small-area electrically erasable programmable read only memory array according to claim 10, wherein said first bit line group includes two said bit lines respectively connected with said first memory cell and said third memory cell, and wherein said second bit line group includes two said bit lines respectively connected with said second memory cell and said fourth memory cell, wherein in two adjacent said sub-memory arrays, two said third memory cells are neighboring and connected with an identical said bit line to share a common contact; said second memory cell and said fourth memory cell are neighboring and connected with an identical said bit line to share a common contact.

15. The method for operating a small-area electrically erasable programmable read only memory array according to claim 10, wherein said P-type FET of said first memory cell has a conduction gate, a drain connected with said first bit line group, and a source connected with said first common source line, and wherein a bias of said first word line is coupled to said P-type FET via a capacitor, and wherein said conduction gate of said P-type FET and said capacitor are made of an identical polysilicon, and wherein said P-type FET receives a bias of said first bit line group and a bias of said common source line to write data into or erase data from said conduction gate, wherein said P-type FET and said capacitor are horizontally formed in a semiconductor substrate.

16. The method for operating a small-area electrically erasable programmable read only memory array according to claim 10, wherein said P-type FET of said second memory cell has a conduction gate, a drain connected with said second bit line group, and a source connected with said first common source line, and wherein a bias of said first word line is coupled to said P-type FET via a capacitor, and wherein said conduction gate of said P-type FET and said capacitor are made of an identical polysilicon, and wherein said P-type FET receives a bias of said second bit line group and a bias of said common source line to write data into or erase data from said conduction gate, wherein said P-type FET and said capacitor are horizontally formed in a semiconductor substrate.

17. The method for operating a small-area electrically erasable programmable read only memory array according to claim 10, wherein said P-type FET of said third memory cell has a conduction gate, a drain connected with said first bit line group, and a source connected with said first common source line, and wherein a bias of said first word line is coupled to said P-type FET via a capacitor, and wherein said conduction gate of said P-type FET and said capacitor are made of an identical polysilicon, and wherein said P-type FET receives a bias of said first bit line group and a bias of said common source line to write data into or erase data from said conduction gate, wherein said P-type FET and said capacitor are horizontally formed in a semiconductor substrate.

18. The method for operating a small-area electrically erasable programmable read only memory array according to claim 10, wherein said P-type FET of said fourth memory cell has a conduction gate, a drain connected with said second bit line group, and a source connected with said first common source line, and wherein a bias of said first word line is coupled to said P-type FET via a capacitor, and wherein said conduction gate of said P-type FET and said capacitor are made of an identical polysilicon, and wherein said P-type FET receives a bias of said second bit line group and a bias of said common source line to write data into or erase data from said conduction gate, wherein said P-type FET and said capacitor are horizontally formed in a semiconductor substrate.

* * * * *